(12) United States Patent
Doris et al.

(10) Patent No.: US 8,492,839 B2
(45) Date of Patent: Jul. 23, 2013

(54) SAME-CHIP MULTICHARACTERISTIC SEMICONDUCTOR STRUCTURES

(75) Inventors: Bruce B. Doris, Brewster, NY (US); Kangguo Cheng, Guilderland, NY (US); Ali Khakifirooz, Slingerlands, NY (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/861,976

(22) Filed: Aug. 24, 2010

(65) Prior Publication Data

US 2012/0049284 A1 Mar. 1, 2012

(51) Int. Cl.
*H01L 27/12* (2006.01)
(52) U.S. Cl.
USPC ............. 257/347; 257/351; 257/E27.112
(58) Field of Classification Search
USPC ................... 257/347, 351, E27.112
See application file for complete search history.

(56) References Cited

U.S. PATENT DOCUMENTS

| | | | | |
|---|---|---|---|---|
| 7,545,001 | B2 * | 6/2009 | Cheng et al. | 257/357 |
| 2003/0230811 | A1 * | 12/2003 | Kim | 257/758 |
| 2005/0082617 | A1 * | 4/2005 | Yoshida | 257/351 |
| 2007/0158704 | A1 * | 7/2007 | Kim et al. | 257/288 |
| 2007/0275528 | A1 * | 11/2007 | Koike | 438/283 |
| 2010/0301416 | A1 * | 12/2010 | Hoentschel et al. | 257/351 |

* cited by examiner

*Primary Examiner* — Phat X Cao
(74) *Attorney, Agent, or Firm* — Harrington & Smith; Louis J. Percello (57) ABSTRACT

In one exemplary embodiment, a semiconductor structure includes: a semiconductor-on-insulator substrate with a top semiconductor layer overlying an insulation layer and the insulation layer overlies a bottom substrate layer; at least one first device at least partially overlying and disposed upon a first portion of the top semiconductor layer, where the first portion has a first thickness, a first width and a first depth; and at least one second device at least partially overlying and disposed upon a second portion of the top semiconductor layer, where the second portion has a second thickness, a second width and a second depth, where at least one of the following holds: the first thickness is greater than the second thickness, the first width is greater than the second width and the first depth is greater than the second depth.

18 Claims, 11 Drawing Sheets

SAME-CHIP MULTICHARACTERISTIC SEMICONDUCTOR STRUCTURES

TECHNICAL FIELD

The exemplary embodiments of this invention relate generally to semiconductor structures and, more specifically, relate to chips having multiple semiconductor structures.

BACKGROUND

Fully depleted thin film semiconductor devices, such as extremely thin semiconductor-on-insulator (ETSOI) devices and field effect transistors (FETs) having one or more fin-shaped channels (FinFETs) with an undoped body, for example, are attractive options for the continued scaling of complementary metal-oxide semiconductor (CMOS) technology.

System-on-chip applications may require the usage of various devices with different characteristics on the same chip. In bulk technology, device characteristics, such as threshold voltage ($V_t$), are generally tuned by well/halo doping. However, such a body doping technique is inapplicable for fully depleted undoped body devices.

BRIEF SUMMARY

In one exemplary embodiment of the invention, a semiconductor structure comprising: a semiconductor-on-insulator substrate comprised of a top semiconductor layer overlying an insulation layer, where the insulation layer overlies a bottom substrate layer; at least one first device at least partially overlying and disposed upon a first portion of the top semiconductor layer, where the first portion of the top semiconductor layer has a first thickness, a first width and a first depth; and at least one second device at least partially overlying and disposed upon a second portion of the top semiconductor layer, where the second portion of the top semiconductor layer has a second thickness, a second width and a second depth, where the first thickness and the second thickness are along a common first axis, where the first width and the second width are along a common second axis, where the first depth and the second depth are along a common third axis, where at least one of the following holds: the first thickness is greater than the second thickness, the first width is greater than the second width and the first depth is greater than the second depth.

In another exemplary embodiment of the invention, a method comprising: providing a semiconductor-on-insulator substrate comprised of a top semiconductor layer overlying an insulation layer, where the insulation layer overlies a bottom silicon layer, where the top semiconductor layer has a first thickness, a first width and a first depth, where the top semiconductor layer comprises a first portion and a second portion; removing part of the second portion of the top semiconductor layer to achieve at least one of: a second thickness that is less than the first thickness, a second width that is less than the first width, and a second depth that is less than the first depth, where the removed part of the second portion is less than an entirety of the second portion; forming at least one first device that at least partially overlies and is disposed upon the first portion of the top silicon layer; and forming at least one second device that at least partially overlies and is disposed upon the second portion of the top silicon layer.

In a further exemplary embodiment of the invention, a semiconductor structure comprising: a substrate; at least one first transistor at least partially overlying the substrate, where the at least one first transistor comprises a first spacer having a first spacer thickness; and at least one second transistor at least partially overlying the substrate, where the at least one second transistor comprises a second spacer having a second spacer thickness, where the first spacer thickness is greater than the second spacer thickness.

In another exemplary embodiment of the invention, a method comprising: providing a substrate; forming at least one first device that at least partially overlies the substrate, where the at least one first device comprises a first transistor with a first spacer having a first spacer thickness; forming at least one second device that at least partially overlies the substrate, where the at least one second device comprises a second transistor with a second spacer having a second spacer thickness; and thinning the second spacer to reduce the second spacer thickness such that the first spacer thickness is greater than the second spacer thickness.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Therefore, it is desirable to provide techniques that enable the formation of various devices (e.g., undoped devices, devices having different characteristics) on a same chip.

The exemplary embodiments of the invention provide techniques and structures that achieve various semiconductor devices (e.g., thin semiconductor devices) having different device characteristics (e.g., for a plurality of devices) on a same chip. As non-limiting examples, this goal may be achieved by providing devices that have different body thicknesses (e.g., different thicknesses of a silicon layer that underlies the devices) and/or devices that have different spacer thicknesses (e.g., for spacers surrounding the device, for spacers surrounding a gate structure of a FET).

In some exemplary embodiments, devices with a thicker body (e.g., a thicker layer of silicon) may have a higher $I_{on}$ (current when devices are on) and $I_{off}$ (current when devices are off) for high performance applications. In some exemplary embodiments, devices with a thinner body may have a lower $I_{on}$ and $I_{off}$ for low power applications. In some exemplary embodiments, devices with a thinner spacer may have a higher $I_{on}$ and $I_{off}$ for high performance applications. In some exemplary embodiments, devices with a thicker spacer may have a lower $I_{on}$ and $I_{off}$ for low power applications.

Figure 1:
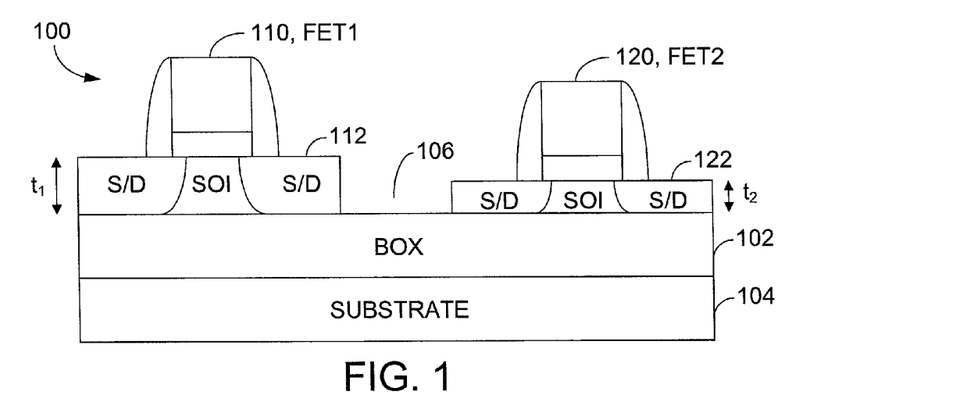
FIG. 1 shows one exemplary embodiment of the invention wherein a chip has two FETs with different body thicknesses.

FIG. 1 shows one exemplary embodiment of the invention wherein a chip 100 has two FETs 110, 120 with different body thicknesses $t_1$, $t_2$. Both FETs 110, 120 are on a semiconductor-on-insulator (SOI) having an insulation layer 102 (e.g., a buried oxide (BOX) layer) overlying a substrate 104 (e.g., silicon, undoped silicon, a bottom silicon layer, a bottom substrate, a bottom substrate layer). The FETs 110, 120 are separated by an isolation structure 106 (e.g., a shallow trench isolation (STI), a mesa structure). Each FET 110, 120 overlies (e.g., is on, is disposed on, is located on) its own top semiconductor layer 112, 122 (e.g., silicon, a top silicon layer, a silicon-containing layer, a top silicon-containing layer, a SOI, a SOI layer, an individual SOI layer) that overlies the BOX 102. The top semiconductor layer 112 for FET1 110 (with a thickness $t_1$) is thicker than the top semiconductor layer 122 for FET2 120 (with a thickness $t_2$). That is, the spacer thickness ($t_1$) for FET1 110 is greater than the spacer thickness ($t_2$) for FET2 120 (i.e., $t_1 > t_2$). As non-limiting examples, $t_1$ may be 10 nm (e.g., approximately, about, substantially) and $t_2$ may be 5 nm (e.g., approximately, about, substantially). As further non-limiting examples, $t_1$ may be 8 nm (e.g., approximately, about, substantially) and $t_2$ may be 5 nm (e.g., approximately, about, substantially). As shown in FIG. 1, the top semiconductor layer 112, 122 for the FETs 110, 120 may have source/drain (S/D) regions (e.g., doped portions of the top semiconductor layer that are coupled to the respective FET(s)).

In some exemplary embodiments, a raised source/drain (RSD) is used for one or more of the S/D regions. The RSD structure(s) may be particularly useful for contacts and/or for thin SOI devices (e.g., ETSOI). In other exemplary embodiments, more than one device (e.g., a plurality of FETs, at least one FET and at least one other device, at least one capacitor) overlie (e.g., is on, is disposed on, is located on) at least one of the top semiconductor layers 112, 122. In further exemplary embodiments, the FETs 110, 120 may comprise one or more FinFETs. In other exemplary embodiments, more than two top semiconductor layers are utilized (e.g., a plurality of separated/individual top semiconductor layer regions/portions having at least two different body thicknesses). In further exemplary embodiments, the top semiconductor layers 112, 122 may be coupled to one another (e.g., the isolation structure 106 may be optional, possibly depending on desired characteristics and/or layout of components).

Figure 2:
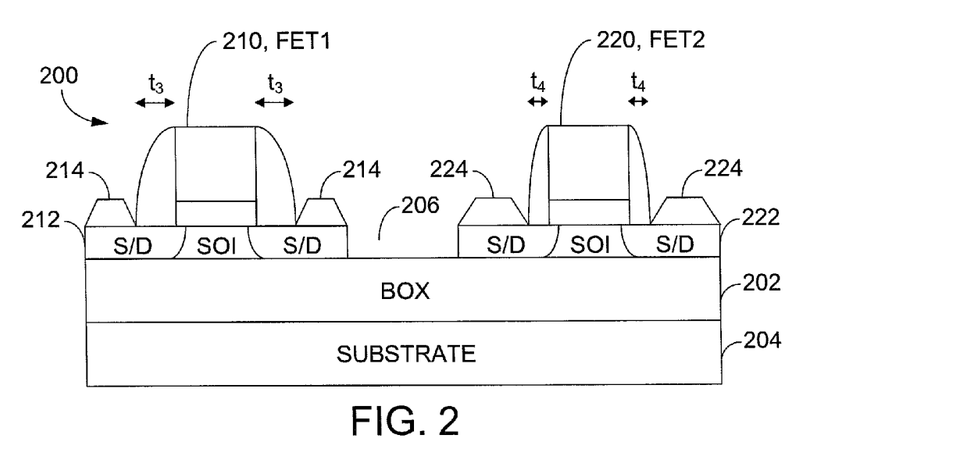
FIG. 2 depicts another exemplary embodiment of the invention wherein a chip has two FETs with different spacer thicknesses.

FIG. 2 depicts another exemplary embodiment of the invention wherein a chip 200 has two FETs 210, 220 with different spacer thicknesses $t_3$, $t_4$. Both FETs 210, 220 are on a semiconductor-on-insulator (SOI) having an insulation layer 202 (e.g., a buried oxide (BOX) layer) overlying a substrate 204 (e.g., silicon, undoped silicon, a bottom silicon layer, a bottom substrate, a bottom substrate layer). The FETs 210, 220 are separated by an isolation structure 206 (e.g., a shallow trench isolation (STI), a mesa structure). Each FET 210, 220 overlies (e.g., is on, is disposed on, is located on) its own top semiconductor layer 212, 222 (e.g., silicon, a top silicon layer, a silicon-containing layer, a top silicon-containing layer, a SOI, a SOI layer, an individual SOI layer) that overlies the BOX 202. The spacers for FET1 210 (with a thickness $t_3$) are thicker than the spacers for FET2 220 (with a thickness $t_4$). That is, the spacer thickness ($t_3$) for FET1 210 is greater than the spacer thickness ($t_4$) for FET2 220 (i.e., $t_3 > t_4$). As non-limiting examples, $t_3$ may be 7.5 nm (e.g., approximately, about, substantially) and $t_4$ may be 6 nm (e.g., approximately, about, substantially). As shown in FIG. 1, the top semiconductor layer 112, 122 for the FETs 110, 120 may have source/drain (S/D) regions (e.g., doped portions of the top semiconductor layer that are coupled to the respective FET(s)). In some exemplary embodiments, a raised source/drain (RSD) 214, 224 is used for one or more of the S/D regions. The RSD structure(s) 214, 224 may be particularly useful for contacts and/or for thin SOI devices (e.g., ETSOI).

In other exemplary embodiments, more than one device (e.g., a plurality of FETs, at least one FET and at least one other device, at least one capacitor) overlie (e.g., is on, is disposed on, is located on) at least one of the top semiconductor layers 212, 222. In further exemplary embodiments, the FETs 110, 120 may comprise one or more FinFETs. In other exemplary embodiments, more than two top semiconductor layers are utilized (e.g., a plurality of separated/individual top semiconductor layer regions/portions). In further exemplary embodiments, the top semiconductor layers 212, 222 may be coupled to one another (e.g., the isolation structure 206 may be optional, possibly depending on desired characteristics and/or layout of components).

While discussed above separately, further exemplary embodiments of the invention may involve the usage of both body size and spacer thickness in order to control, affect or modify device characteristics. For example, such usage may enable fine tuning of the individual devices in accordance with various categories, such as: (1) thick-body, thick-spacer devices; (2) thick-body, thin-spacer devices; (3) thin-body, thick-spacer devices; and/or (4) thin-body, thin-spacer devices, as non-limiting examples. The use of at least four categories (e.g., the four identified immediately above) instead of two (e.g., thin-body vs. thick-body or thin-spacer vs. thick-spacer) may provide more options and better selection of suitable and/or desired device characteristics. In other exemplary embodiments, fewer than four of the above-noted categories may be used for a given chip.

Figure 3:
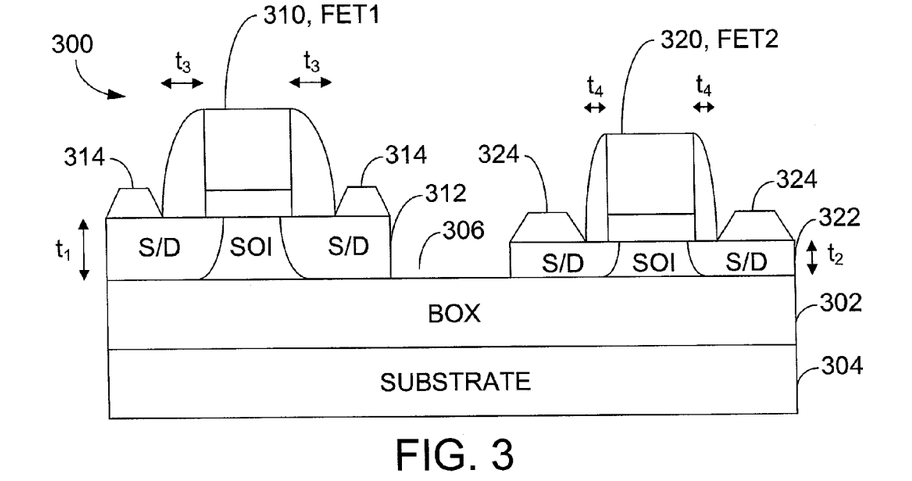
FIG. 3 illustrates an exemplary embodiment of the invention (i.e., a chip) that utilizes both body size and spacer thickness to tune the respective devices.

FIG. 3 illustrates an exemplary embodiment of the invention (i.e., a chip 300) that utilizes both body size and spacer thickness to tune the respective devices. In FIG. 3, a chip 300 has two FETs 310, 320 with different body thicknesses $t_1$, $t_2$ and different spacer thicknesses $t_3$, $t_4$, respectively. Both FETs 310, 320 are on a semiconductor-on-insulator (SOI) having an insulation layer 302 (e.g., a buried oxide (BOX) layer) overlying a substrate 304 (e.g., silicon, undoped silicon, a bottom silicon layer, a bottom substrate, a bottom substrate layer). The FETs 310, 320 are separated by an isolation structure 306 (e.g., a shallow trench isolation (STI), a mesa structure). Each FET 310, 320 overlies (e.g., is on, is disposed on, is located on) its own top semiconductor layer 312, 322 (e.g., silicon, a top silicon layer, a silicon-containing layer, a top silicon-containing layer, a SOI, a SOI layer, an individual SOI layer) that overlies the BOX 302. The top semiconductor layer 312 for FET1 310 (with a thickness $t_1$) is thicker than the top semiconductor layer 322 for FET2 320 (with a thickness $t_2$). That is, the top semiconductor layer thickness ($t_1$) for FET1 110 is greater than the top semiconductor layer thickness ($t_2$) for FET2 120 (i.e., $t_1 > t_2$). As non-limiting examples, $t_1$ may be 8-10 nm (e.g., approximately, about, substantially) and $t_2$ may be 5 nm (e.g., approximately, about, substantially).

The spacers for FET3 310 (with a thickness $t_3$) are thicker than the spacers for FET2 320 (with a thickness $t_4$). That is, the spacer thickness ($t_3$) for FET1 310 is greater than the spacer thickness ($t_4$) for FET2 320 (i.e., $t_3 > t_4$). As non-limiting examples, $t_3$ may be 7.5 nm (e.g., approximately, about, substantially) and $t_4$ may be 6 nm (e.g., approximately, about, substantially). As shown in FIG. 3, the top semiconductor layer 312, 322 for the FETs 310, 320 may have source/drain (S/D) regions (e.g., doped portions of the top semiconductor layer that are coupled to the respective FET(s)). In some exemplary embodiments, a raised source/drain (RSD) 314, 324 is used for one or more of the S/D regions. The RSD structure(s) 314, 324 may be particularly useful for contacts and/or for thin SOI devices (e.g., ETSOI).

Figure 4:
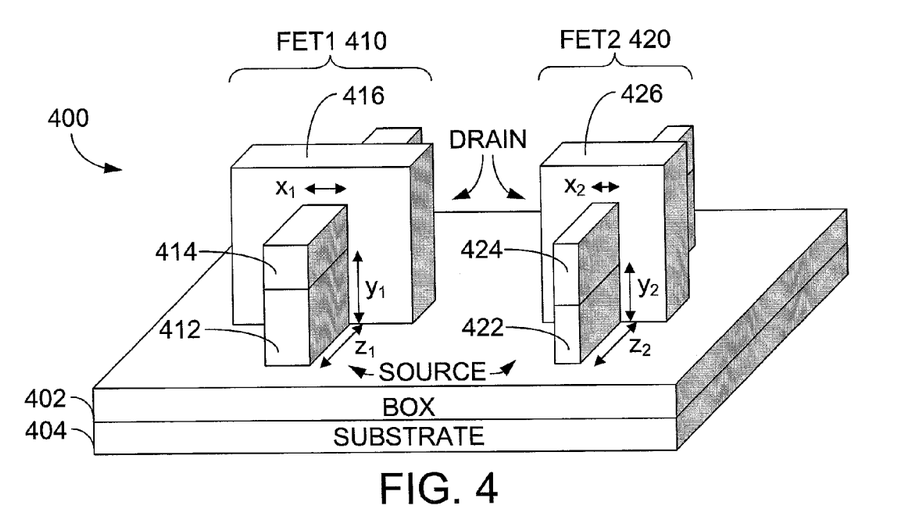
FIG. 4 depicts an exemplary embodiment of the invention (i.e., a chip) that includes two FinFETs.

FIG. 4 depicts an exemplary embodiment of the invention (i.e., a chip 400) that includes two FinFETs (FET1 410 and FET2 420). Each FinFET 410, 420 includes a separate semiconductor layer 412, 422 that underlies an insulator 414, 424 (e.g., a nitride, a nitride cap). The FinFETs 410, 420 include a semiconductor-on-insulator (SOI) (the semiconductor layers 412, 422, also referred to as top semiconductor layers) overlying an insulation layer 402 (e.g., a buried oxide (BOX) layer) that itself overlies a substrate 404 (e.g., silicon, undoped silicon, a bottom silicon layer, a bottom substrate, a bottom substrate layer). Each FinFET 410, 420 has a gate 416, 426 that enables activation of the respective FET. Note that the semiconductor layers 412, 422 of the two FETs 410, 420 have different thicknesses ($y_1$ and $y_2$), for example, with the semiconductor layer 412 of FET1 410 being thicker than the semiconductor layer 422 of FET2 420 ($y_1 > y_2$).

In further exemplary embodiments, and as shown in FIG. 4, in addition or in the alternative to the semiconductor layers 412, 422 of the FinFETs 410, 420 having different thicknesses (e.g., thickness, height, depth), the semiconductor layers 412, 422 may have different widths ($x_1$ and $x_2$), for example, with the semiconductor layer 412 of FET1 410 being wider than the semiconductor layer 422 of FET2 420 ($x_1 > x_2$).

In further exemplary embodiments, in addition or in the alternative to the semiconductor layers 412, 422 of the FinFETs 410, 420 having different thicknesses ($y_1$ and $y_2$) and/or different widths ($x_1$ and $x_2$), the semiconductor layers 412, 422 may have different depths ($z_1$ and $z_2$), for example, with the semiconductor layer 412 of FET1 410 being deeper than the semiconductor layer 422 of FET2 420 ($z_1 > z_2$). As may be appreciated, the different thicknesses, widths and/or depths enable the formation of semiconductor devices (e.g., FinFETs) having different device characteristics on a same chip.

As an example, to achieve different widths of the fins, one can start by forming both fins with a same width using any suitable known techniques in the art (e.g., sidewall image transfer). Subsequently, a mask is used to cover one fin (e.g., the wider one) and expose the other fin (e.g., the narrower one). The exposed fin is then thinned, for example, by etching. For example, if the fin is silicon one can use an aqueous solution containing ammonia to etch the silicon. Alternatively, in other exemplary embodiments an oxidation is performed to convert a portion of the fin into oxide. Subsequently, an oxide etch process (e.g., by hydrofluoric acid) is performed to etch the oxide and remove it (e.g., substantially).

Figure 5:
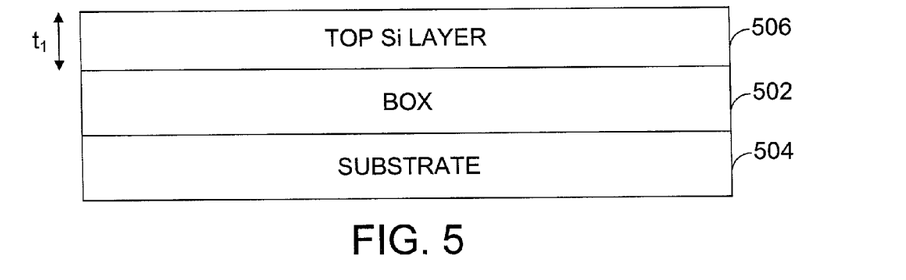
FIGS. 5-11 show an exemplary method for producing a chip similar to the one shown in FIG. 1.
Figure 6:
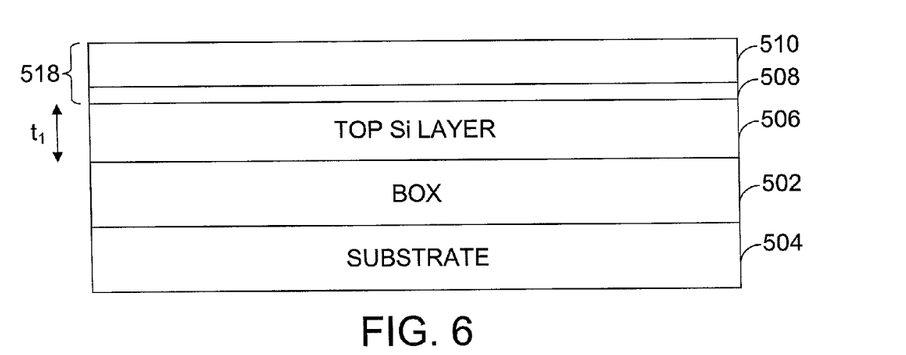
Figure 7:
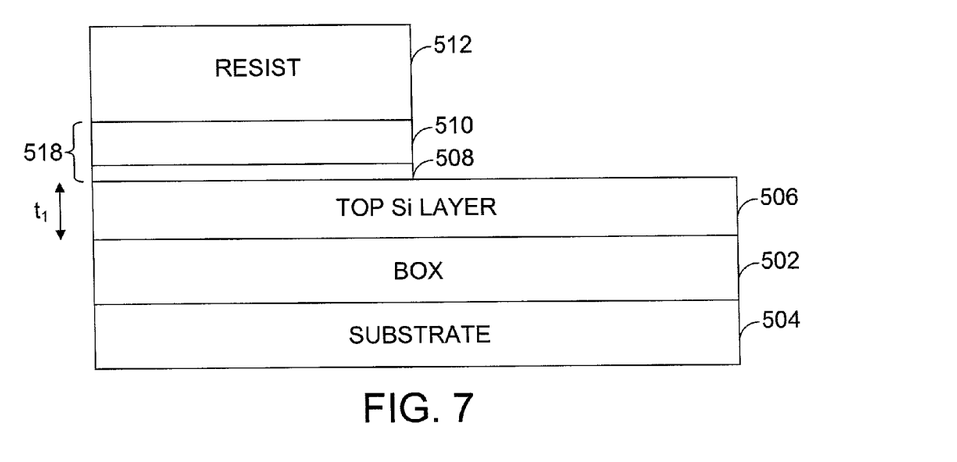

FIGS. 5-11 show an exemplary method for producing a chip similar to the one shown in FIG. 1. As shown in FIG. 5, begin with a SOI substrate comprising a top semiconductor layer, such as a top Si layer 506 (e.g., SOI), overlying an insulation layer 502 (e.g., BOX) that itself overlies a substrate 504. The thickness of the top Si layer 506 should be $t_1$, the thicker of the two desired body thicknesses (e.g., about 10 nm). In FIG. 6, a pad layer 518 is deposited. The pad layer 518 comprises a pad oxide 508 and a pad nitride 510. In FIG. 7, a resist layer 512 is used as a pattern to remove the pad layer 518 from a second region of the chip (i.e., a second device region). The first region (i.e., the first device region) is the portion of the chip in FIG. 7 that is still covered by the pad layer 518. By removing the pad layer 518 from the second region, the top Si layer 506 is exposed only for this portion of the chip.

Figure 8:
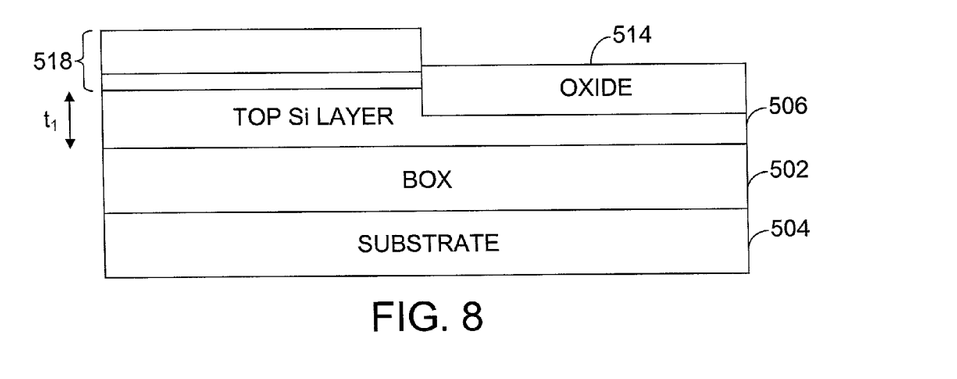
Figure 9:
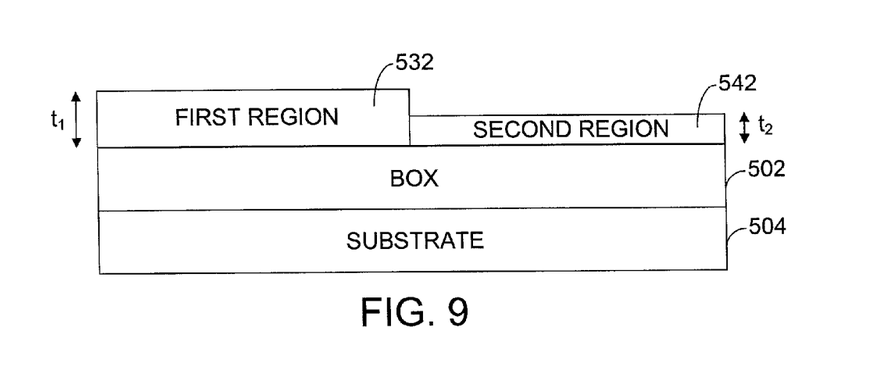
Figure 10:
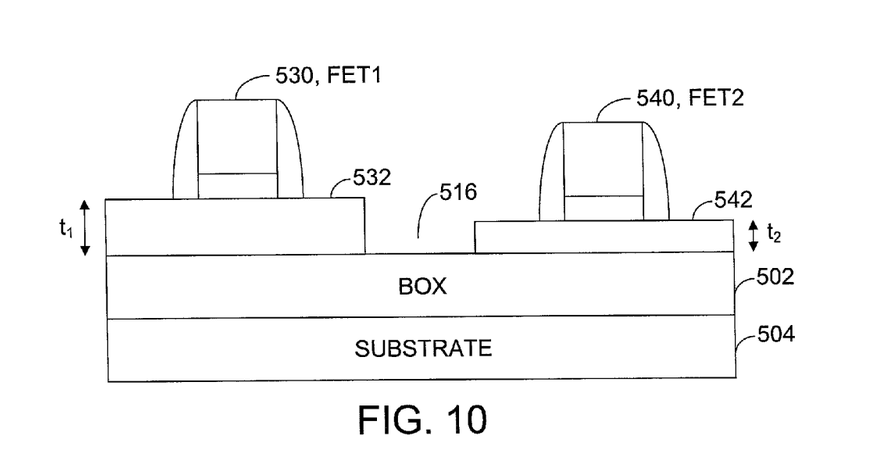
Figure 11:
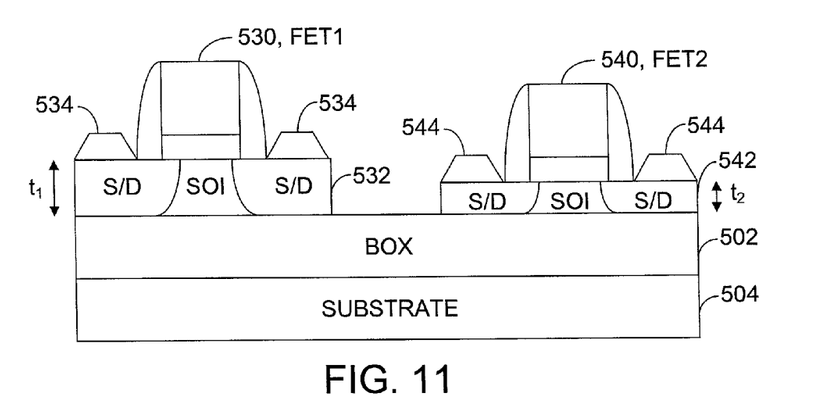

In FIG. 8, the resist 512 is stripped and oxidization is used to consume part (e.g., about 5 nm) of the exposed top Si layer 506, resulting in the formation of oxide 514 at the second device region. In FIG. 9, the pad layer 518 and oxide 514 are removed. The resulting structure is a chip having two SOI regions: a first region 532 having a thickness of $t_1$ (e.g., about 10 nm) and a second region 542 having a thickness of $t_2$ (e.g., about 5 nm). As is apparent from FIG. 9, $t_1 > t_2$. Note that reference numbers 532 and 542 in FIGS. 9-11, while labeled in FIG. 9 as "first portion" and "second portion" respectively, directly correspond to the top Si layer (e.g., the SOI) for the respective device regions. In FIG. 10, an isolation structure 516 (e.g., mesa, STI) is formed. In addition, gates and spacers are formed for the two devices, forming a first FET (FET1) 530 and a second FET (FET2) 540. In FIG. 11, sources/drains (S/Ds) are formed in the respective top Si layers 532, 542. In addition, RSD structures 534, 544 are formed for the FETs 530, 540. The RSD can be in-situ doped or undoped. The S/D extensions are formed, for example, by driving dopant from in-situ doped RSD structures or by implantation followed by anneal. The difference in body thickness ($t_1$ and $t_2$) between FET1 530 and FET2 540 result in different device characteristics.

Figure 12:
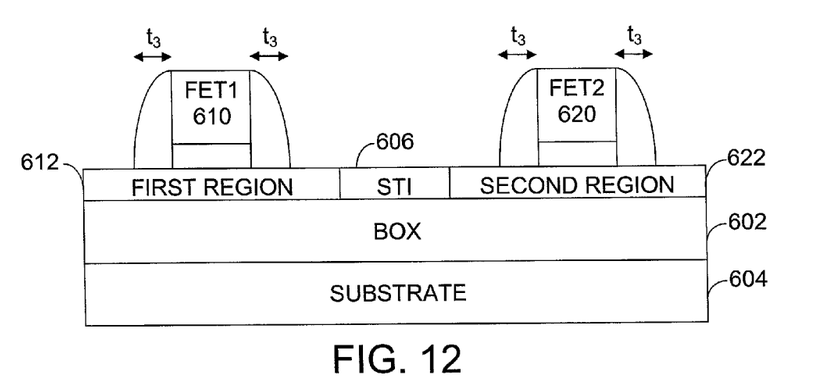
FIGS. 12-15 show an exemplary method for producing a chip similar to the one shown in FIG. 2.

FIGS. 12-15 show an exemplary method for producing a chip similar to the one shown in FIG. 2. As shown in FIG. 12, begin with a SOI substrate comprising a top Si layer (e.g., SOI) overlying an insulation layer 602 (e.g., BOX) that itself overlies a substrate 604. The top Si layer is divided into two regions: a first region (a first device region) 612 and a second region (a second device region) 622. The two regions are separated by an isolation structure (e.g., a STI 606). A first FET (FET1) 610 is formed on the first region 612 while a second FET (FET2) 620 is formed on the second region 622. Note that both of the FETs have a gate structure with spacers that have a same thickness $t_3$.

Figure 13:
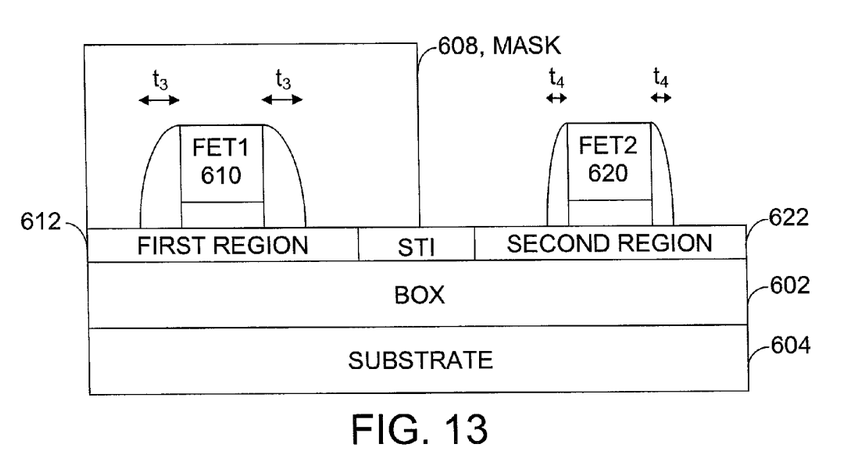
Figure 14:
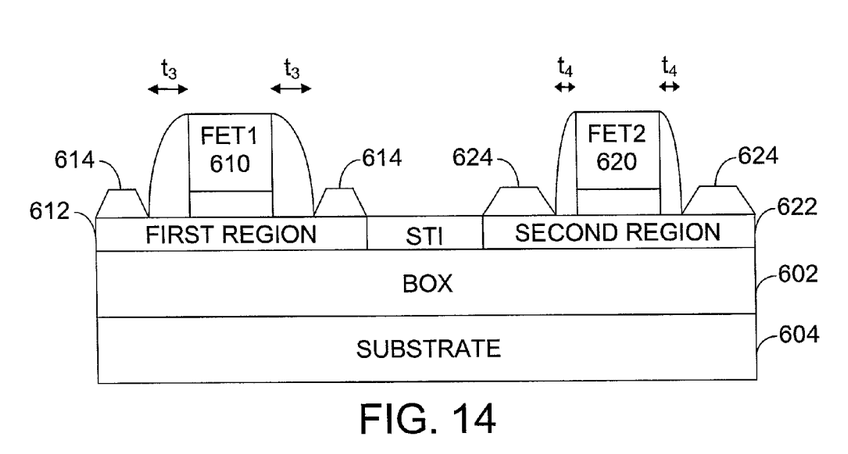
Figure 15:
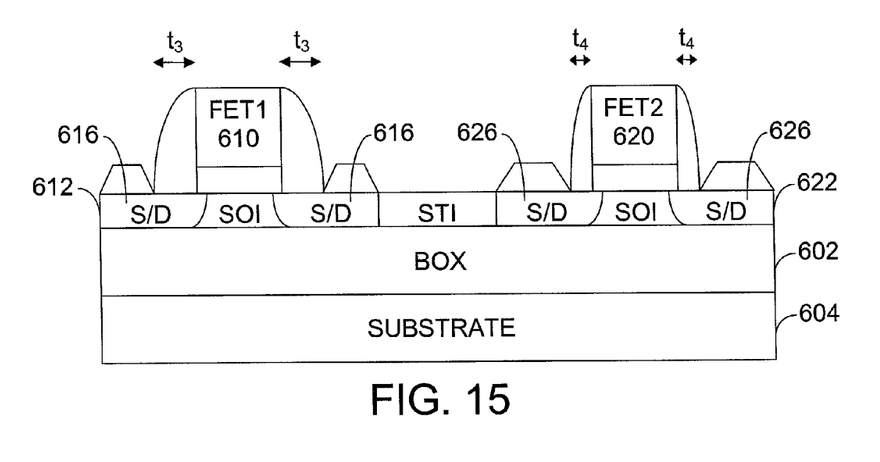

In FIG. 13, a mask 608 is applied in order to mask the FET1 610 and leave the FET2 620 exposed. The spacer of the exposed FET2 620 is thinned to a smaller thickness of $t_4$ (i.e., $t_3 > t_4$). As a non-limiting example, the spacer of FET2 620 may be thinned by using an etch. As a further non-limiting example, 300:1 diluted HF acid may be used to etch the spacer very precisely. In FIG. 14, the mask 608 is removed and RSD structures 614, 624 are formed for the FETs 530, 540. The RSD can be in-situ doped or undoped. In FIG. 15, the S/D extensions 616, 626 are formed, for example, by driving dopant from in-situ doped RSD structures or by implantation followed by anneal. The difference in spacer thickness ($t_3$ and $t_4$) between FET1 610 and FET2 620 result in different extension dopant profiles and, therefore, different device characteristics.

It is noted that in some exemplary embodiments, the exact coverage of the mask 608 in FIG. 13 is not critical as long as the spacer in the second FET, FET2 620, is exposed and thinned. Whether or not other elements of the device (e.g., BOX 602 exposed via the STI 606, gate cap of FET2 620) are etched during the spacer etch depends on the materials of these components, the material of the exposed spacer and the etchant used. For example, if the BOX were silicon oxide, the exposed spacer and the gate cap were silicon nitride, and the etchant were hot phosphoric acid (which etches silicon nitride selective to silicon oxide), then no BOX would be etched away. Regardless, in some exemplary embodiments the spacer etch is considered mild since one may be etching only a small portion of the spacer. In such a case, the loss of BOX or gate cap during the spacer etch may be insignificant compared with the original thickness of the BOX and/or gate cap.

As described herein, it should be clear that the difference in body thickness and/or spacer thickness between the devices in question is outside (e.g., greater than) the range of normal tolerances. As a non-limiting example, and assuming that the normal tolerance is on the order of 5% or less, the difference in body thickness and/or spacer thickness may be greater than a 5% difference. In some exemplary embodiments, the different in body thickness and/or spacer thickness may be greater than or equal to 20-35%. As such, the difference in body thickness and/or spacer thickness will not, for example, be an incidental characteristic that occurs through normal usage of the materials in question nor as a result of normal process variations (e.g., in the formation of the semiconductor structure/device). As is apparent from FIGS. 5-15 and the accompanying description thereof, the difference in body thickness and/or spacer thickness is a purposeful characteristic that is designed to result in specific, different device characteristics.

One of ordinary skill in the art will appreciate the various techniques available to form the above-described structures.

In some exemplary embodiments, one or more of the RSD structures are formed using epitaxial deposition. In some exemplary embodiments of the invention the epitaxially deposited material matches the composition of the surface of the body. For example, if the body is essentially Si, the epitaxially deposited material may be essentially/primarily Si. As a further example, if there is a Ge content at the surface, the epitaxially deposited material may match that Ge content. In an alternative exemplary embodiment of the invention, the composition of the epitaxially deposited material is different from the composition of the surface of the body. For example, if the body is essentially/primarily Si, the epitaxially deposited material may be SiGe or Si:C. During the epitaxy process, the epi layer can be in-situ doped with one or more dopants such as phosphorus, arsenic, boron, and/or indium, as non-limiting examples. Alternatively, the epi layer can be ex-situ doped by performing a doping process after the epitaxy process. The doping techniques may include, but are not limited to: ion implantation, gas phase doping, plasma doping, plasma immersion ion implantation, cluster doping, infusion doping, liquid phase doping, and solid phase doping One or multiple cleaning processes may be performed before the epitaxy process to remove oxygen or other undesired material from the surface of the exposed semiconductor material in order to improve the epitaxy quality. The cleaning processes may include, but are not limited to: etching in a solution containing hydrofluoric acid and plasma etching with fluorine-containing species. As non-limiting examples, such fluorine-containing species include: ammonia (NH3), nitrogen trifluoride (NF3), ammonia fluoride (NH4F), ammonium hydrogen fluoride (NH4F.HF), and ammonium hexafluorosilicate ((NH4)2SiF6). In addition or in the alternative, a hydrogen prebake process may be performed after the above cleaning process and before the actual start of the epitaxy. For example, the semiconductor substrate may be heated at a temperature ranging from 700° C. to 950° C. in a hydrogen containing environment (e.g., for 10 to 200 seconds). This can be performed in the epitaxy chamber right before the epitaxy process to further clean the (exposed) semiconductor surface.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In one exemplary embodiment, a semiconductor structure comprising: a semiconductor-on-insulator substrate comprised of a top semiconductor layer overlying an insulation layer, where the insulation layer overlies a bottom substrate layer; at least one first device at least partially overlying and disposed upon a first portion of the top semiconductor layer, where the first portion of the top semiconductor layer has a first body thickness; and at least one second device at least partially overlying and disposed upon a second portion of the top semiconductor layer, where the second portion of the top semiconductor layer has a second body thickness, where the first body thickness is greater than the second body thickness.

A semiconductor structure as above, where the at least one first device comprises at least one first transistor and the at least one second device comprises at least one second transistor. A semiconductor structure as in any above, where the at least one first transistor comprises a first spacer having a first spacer thickness, where the at least one second transistor comprises a second spacer having a second spacer thickness, where the first spacer thickness is greater than the second spacer thickness. A semiconductor structure as in any above, further comprising at least one raised source/drain structure coupled to at least one of the at least one first device and the at least one second device. A semiconductor structure as in any above, where the first portion is separated from the second portion by an isolation structure. A semiconductor structure as in any above, where the semiconductor-on-insulator substrate comprises a thin semiconductor-on-insulator or an extremely thin silicon-on-insulator. A semiconductor structure as in any above, where a difference in thickness between the first body thickness and the second body thickness is outside a range of normal tolerance. A semiconductor structure as in any above, further comprising one or more aspects of the exemplary embodiments of the invention as described herein.

Figure 16:
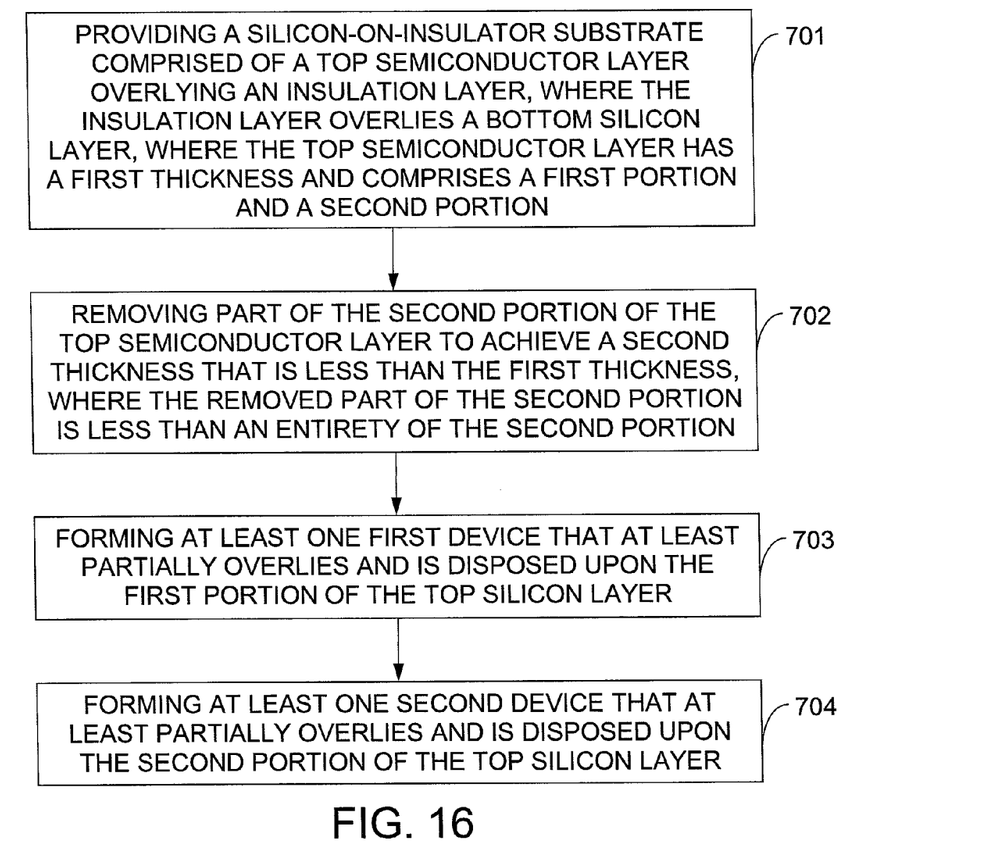
FIG. 16 depicts a flowchart illustrating one non-limiting example of a method for practicing the exemplary embodiments of this invention.

(2) In a further exemplary embodiment, and as shown in FIG. 16, a method comprising: providing a semiconductor-on-insulator substrate comprised of a top semiconductor layer overlying an insulation layer, where the insulation layer overlies a bottom silicon layer, where the top semiconductor layer has a first thickness and comprises a first portion and a second portion (701); removing part of the second portion of the top semiconductor layer to achieve a second thickness that is less than the first thickness, where the removed part of the second portion is less than an entirety of the second portion (702); forming at least one first device that at least partially overlies and is disposed upon the first portion of the top silicon layer (703); and forming at least one second device that at least partially overlies and is disposed upon the second portion of the top silicon layer (704).

A method as above, where the at least one first device comprises at least one first transistor and the at least one second device comprises at least one second transistor. A method as in any above, where the at least one first transistor comprises a first spacer having a first spacer thickness, where the at least one second transistor comprises a second spacer having a second spacer thickness, the method further comprising: thinning the second spacer to reduce the second spacer thickness such that the first spacer thickness is greater than the second spacer thickness. A method as in any above, further comprising: forming at least one raised source/drain structure coupled to at least one of the at least one first device and the at least one second device. A method as in any above, further comprising: forming at least one isolation structure that separates the first portion from the second portion. A method as in any above, where the semiconductor-on-insulator substrate comprises a thin semiconductor-on-insulator or an extremely thin silicon-on-insulator. A method as in any above, where a difference in thickness between the first body thickness and the second body thickness is outside a range of normal tolerance. A method as in any above, further comprising one or more aspects of the exemplary embodiments of the invention as described herein.

A semiconductor structure formed in accordance with any of the above methods (i.e., one or more of the above-described methods).

(3) In another exemplary embodiment, a semiconductor structure comprising: a substrate; at least one first transistor at least partially overlying the substrate, where the at least one first transistor comprises a first spacer having a first spacer thickness; and at least one second transistor at least partially overlying the substrate, where the at least one second transistor comprises a second spacer having a second spacer thickness, where the first spacer thickness is greater than the second spacer thickness.

A semiconductor structure as above, where the at least one first transistor comprises at least one first field effect transistor and the at least one second transistor comprises at least one second field effect transistor. A semiconductor structure as in any above, further comprising at least one raised source/drain structure coupled to at least one of the at least one first transistor and the at least one second transistor. A semiconductor structure as in any above, further comprising at least one first raised source/drain structure coupled to the at least one first transistor and at least one second raised source/drain structure coupled to the at least one second transistor, where the at least one first raised source/drain structure has a first length and the at least one second raised source/drain structure has a second length, where the first length is less than the second length. A semiconductor structure as in any above, where the at least one first transistor is separated from the at least one second transistor by an isolation structure. A semiconductor structure as in any above, where the substrate comprises a semiconductor-on-insulator substrate, a thin semiconductor-on-insulator substrate or an extremely thin semiconductor-on-insulator substrate. A semiconductor structure as in any above, where a difference in thickness between the first spacer thickness and the second spacer thickness is outside a range of normal tolerance. A semiconductor structure as in any above, further comprising one or more aspects of the exemplary embodiments of the invention as described herein.

Figure 17:
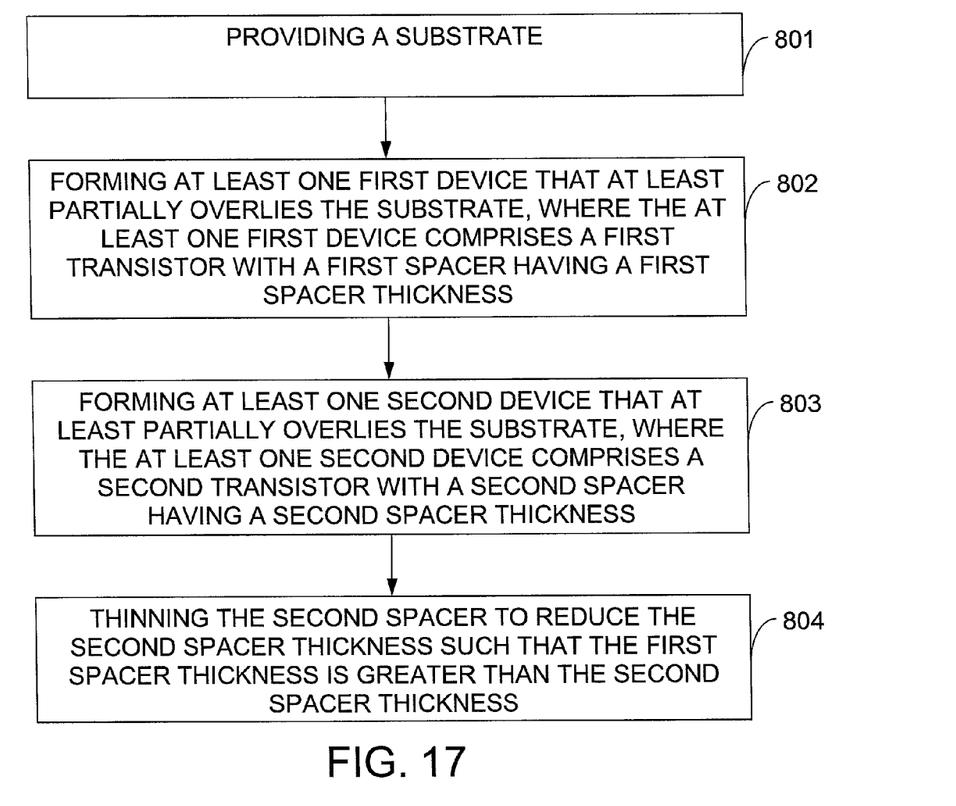
FIG. 17 depicts a flowchart illustrating another non-limiting example of a method for practicing the exemplary embodiments of this invention.

(4) In another exemplary embodiment, and as shown in FIG. 17, a method comprising: providing a substrate (801); forming at least one first device that at least partially overlies the substrate, where the at least one first device comprises a first transistor with a first spacer having a first spacer thickness (802); forming at least one second device that at least partially overlies the substrate, where the at least one second device comprises a second transistor with a second spacer having a second spacer thickness (803); and thinning the second spacer to reduce the second spacer thickness such that the first spacer thickness is greater than the second spacer thickness (804).

A method as above, where the at least one first device comprises at least one first field effect transistor and the at least one second device comprises at least one second field effect transistor. A method as in any above, further comprising: forming at least one raised source/drain structure coupled to at least one of the at least one first device and the at least one second device. A method as in any above, further comprising: forming at least one first raised source/drain structure coupled to the at least one first transistor; and forming at least one second raised source/drain structure coupled to the at least one second transistor, where the at least one first raised source/drain structure has a first length and the at least one second raised source/drain structure has a second length, where the first length is less than the second length. A method as in any above, further comprising: forming at least one isolation structure that separates the at least one first device from the at least one second device. A method as in any above, where the substrate comprises a semiconductor-on-insulator substrate, a thin semiconductor-on-insulator substrate or an extremely thin semiconductor-on-insulator substrate. A method as in any above, where a difference in thickness between the first spacer thickness and the second spacer thickness is outside a range of normal tolerance. A method as in any above, where thinning comprises using an etch. A method as in any above, where thinning comprises using a HF etch. A method as in any above, further comprising one or more aspects of the exemplary embodiments of the invention as described herein.

A semiconductor structure formed in accordance with any of the above methods (i.e., one or more of the above-described methods).

(5) In another exemplary embodiment, a semiconductor structure comprising: a semiconductor-on-insulator substrate comprised of a top semiconductor layer overlying an insulation layer, where the insulation layer overlies a bottom substrate layer; at least one first device at least partially overlying and disposed upon a first portion of the top semiconductor layer, where the first portion of the top semiconductor layer has a first thickness, a first width and a first depth; and at least one second device at least partially overlying and disposed upon a second portion of the top semiconductor layer, where the second portion of the top semiconductor layer has a second thickness, a second width and a second depth, where the first thickness and the second thickness are along a common first axis, where the first width and the second width are along a common second axis, where the first depth and the second depth are along a common third axis, where at least one of the following holds: the first thickness is greater than the second thickness, the first width is greater than the second width and the first depth is greater than the second depth A semiconductor structure as above, where the at least one first device comprises at least one first transistor and the at least one second device comprises at least one second transistor. A semiconductor structure as in any above, where the at least one first transistor comprises a first spacer having a first spacer thickness, where the at least one second transistor comprises a second spacer having a second spacer thickness, where the first spacer thickness is greater than the second spacer thickness. A semiconductor structure as in any above, further comprising at least one raised source/drain structure coupled to at least one of the at least one first device and the at least one second device. A semiconductor structure as in any above, where the first portion is separated from the second portion by an isolation structure. A semiconductor structure as in any above, where the semiconductor-on-insulator substrate comprises a thin semiconductor-on-insulator or an extremely thin silicon-on-insulator. A semiconductor structure as in any above, where a difference between at least one of the first thickness and the second thickness, the first width and the second width, and the first depth and second depth is outside a range of normal tolerance.

A semiconductor structure as in any above, further comprising one or more aspects of the exemplary embodiments of the invention as described herein.

Figure 18:
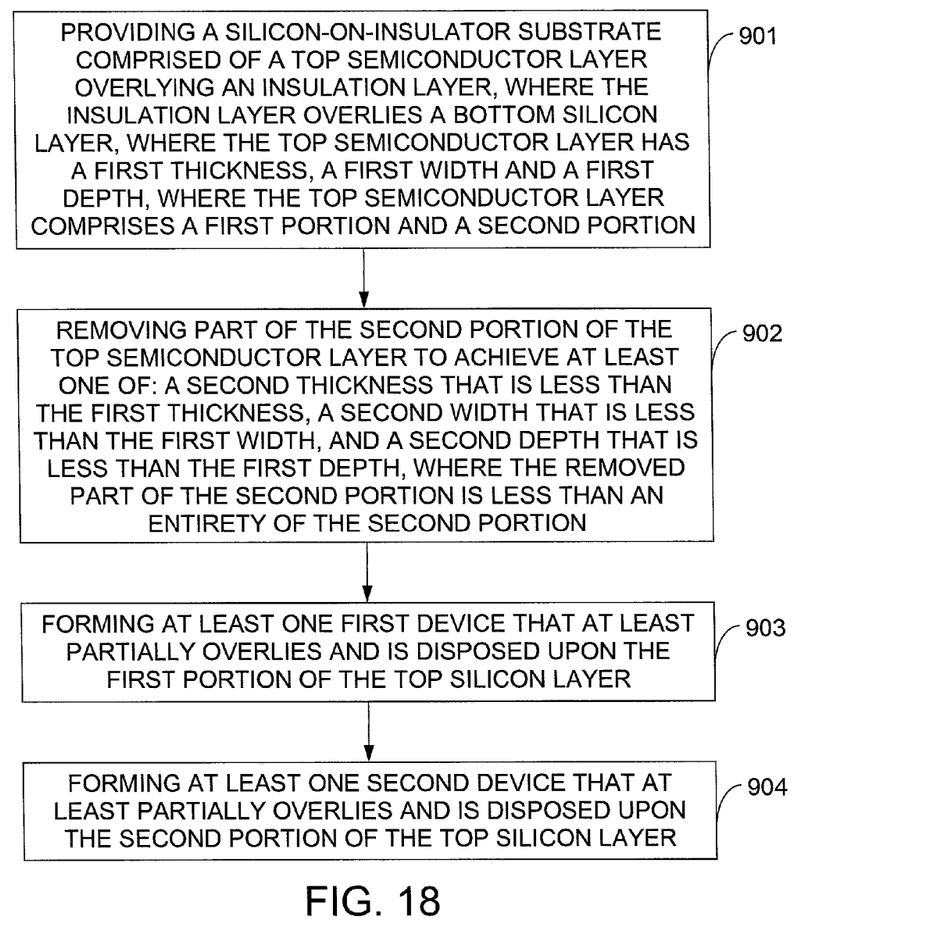
FIG. 18 depicts a flowchart illustrating another non-limiting example of a method for practicing the exemplary embodiments of this invention.

(6) In another exemplary embodiment, and as shown in FIG. 18, a method comprising: providing a semiconductor-on-insulator substrate comprised of a top semiconductor layer overlying an insulation layer, where the insulation layer overlies a bottom silicon layer, where the top semiconductor layer has a first thickness, a first width and a first depth, where the top semiconductor layer comprises a first portion and a second portion (901); removing part of the second portion of the top semiconductor layer to achieve at least one of: a second thickness that is less than the first thickness, a second width that is less than the first width, and a second depth that is less than the first depth, where the removed part of the second portion is less than an entirety of the second portion (902); forming at least one first device that at least partially overlies and is disposed upon the first portion of the top silicon layer (903); and forming at least one second device that at least partially overlies and is disposed upon the second portion of the top silicon layer (904).

A method as above, where the at least one first device comprises at least one first transistor and the at least one second device comprises at least one second transistor. A method as in any above, where the at least one first transistor comprises a first spacer having a first spacer thickness, where the at least one second transistor comprises a second spacer having a second spacer thickness, the method further comprising: thinning the second spacer to reduce the second spacer thickness such that the first spacer thickness is greater than the second spacer thickness. A method as in any above, further comprising: forming at least one raised source/drain structure coupled to at least one of the at least one first device and the at least one second device. A method as in any above, further comprising: forming at least one isolation structure that separates the first portion from the second portion. A method as in any above, where the semiconductor-on-insulator substrate comprises a thin semiconductor-on-insulator or an extremely thin silicon-on-insulator. A method as in any above, where a difference between at least one of the first thickness and the second thickness, the first width and the second width, and the first depth and second depth is outside a range of normal tolerance.

A method as in any above, where forming the at least one first device and forming the at least one second device are performed after removing the part of the second portion of the top semiconductor layer. A method as in any above, where forming the at least one first device and forming the at least one second device are performed before removing the part of the second portion of the top semiconductor layer. A method as in any above, where the at least one first device comprises a first fin field effect transistor and the at least one second device comprises a second fin field effect transistor. A method as in any above, where removing the part of the second portion of the top semiconductor layer comprises performing an etch. A method as in any above, where removing the part of the second portion of the top semiconductor layer comprises performing an etch on the at least one second device. A method as in any above, further comprising one or more aspects of the exemplary embodiments of the invention as described herein.

A semiconductor structure formed in accordance with any of the above methods (i.e., one or more of the above-described methods).

The blocks shown in FIGS. 16, 17 and 18 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 16, 17 and 18 should be considered merely exemplary and non-limiting. It should be appreciated that the blocks shown in FIGS. 16, 17 and 18 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 16, 17 and 18 so as to implement one or more further exemplary embodiments of the invention.

That is, the exemplary embodiments of the invention shown in FIGS. 16, 17 and 18 may be utilized, implemented or practiced in conjunction with one or more further aspects in any combination (e.g., any combination that is suitable, practicable and/or feasible) and are not limited only to the steps, blocks, operations and/or functions shown in FIGS. 16, 17 and 18.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly," "polysilicon" or "poly Si" should be understood to refer to polycrystalline silicon.

While described herein in relation to a layer of BOX, the exemplary embodiments are not limited thereto and may be used in conjunction any suitable layer of insulating material. Furthermore, while described herein in relation to one or more transistors, the exemplary embodiments are not limited thereto and may be used in conjunction any suitable electronic device or structure.

While described above at least partly in relation to a top semiconductor layer that comprises silicon, the exemplary embodiments of the invention are not limited thereto, and may be utilized in conjunction with any suitable semiconductor material. For example, besides Si, the top semiconductor layer (i.e., the semiconductor layer overlying the insulator) may comprise one or more of: germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable semiconductor materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In further exemplary embodiments, the semiconductor layer may also comprise an organic semiconductor or a layered semiconductor. A portion or the entirety of the semiconductor layer may comprise amorphous, polycrystalline or monocrystalline material. In other exemplary embodiments, the top semiconductor layer may be doped, undoped or contain doped regions and undoped regions therein. In further exemplary embodiments, the top semiconductor layer may contain regions with strain and/or regions without strain, or contain regions of tensile strain and/or compressive strain.

While described above primarily in relation to semiconductor-on-insulator (SOI) structures and ETSOI structures in particular, the exemplary embodiments of the invention are not limited thereto, and may be utilized in conjunction with any suitable substrate. Similarly, while described above primarily in relation to transistors and FETs in particular, the exemplary embodiments of the invention are not limited thereto, and may be utilized in conjunction with any suitable semiconductor device(s) whose characteristics may be modified, changed, affected or tuned in accordance with the exemplary embodiments of the invention.

One of ordinary skill in the art will appreciate the various methods, techniques, components and/or materials available to form the various structures and perform the various steps described herein. Any suitable method, technique, component and/or material may be utilized in conjunction with the described structures and methods in order to perform and/or realize the exemplary embodiments of the invention as described herein.

Any use of the terms "connected," "coupled" or variants thereof should be interpreted to indicate any such connection or coupling, direct or indirect, between the identified elements.

As a non-limiting example, one or more intermediate elements may be present between the "coupled" elements. The connection or coupling between the identified elements maybe, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
   providing a semiconductor-on-insulator substrate comprised of a top semiconductor layer overlying an insulation layer, where the insulation layer overlies a bottom silicon layer, where the top semiconductor layer has a first thickness, a first width and a first depth, where the top semiconductor layer comprises a first portion and a second portion;
   removing part of the second portion of the top semiconductor layer to achieve at least one of a second width that is less than the first width, and a second depth that is less than the first depth, where the removed part of the second portion is less than an entirety of the second portion;
   disposing a first insulator on the first portion of the top semiconductor layer and a second insulator on the second portion of the top semiconductor layer, where a total thickness of the first portion substantially equals a total thickness of the second portion;
   forming at least one first device that at least partially overlies and is disposed upon the first insulator and the first portion of the top silicon layer; and
   forming at least one second device that at least partially overlies and is disposed upon the second insulator and the second portion of the top silicon layer.

2. The method of claim 1, where the at least one first device comprises at least one first transistor and the at least one second device comprises at least one second transistor, where the at least one first transistor comprises a first spacer having a first spacer thickness, where the at least one second transistor comprises a second spacer having the first spacer thickness, the method further comprising: thinning the second spacer to achieve a second spacer thickness that is less than the first spacer thickness.

3. The method of claim 1, further comprising: forming at least one raised source/drain structure coupled to at least one of the at least one first device and the at least one second device.

4. The method of claim 1, further comprising: forming at least one isolation structure that separates the first portion from the second portion.

5. The method of claim 1, where the semiconductor-on-insulator substrate comprises an extremely thin silicon-on-insulator.

6. The method of claim 1, where a difference between at least one of the first width and the second width and the first depth and second depth is about 5% to about 35%.

7. The method of claim 1, where the removal of part of the second portion of the top semiconductor layer achieves a second width that is less than the first width.

8. The method of claim 1, where the removal of part of the second portion of the top semiconductor layer achieves a second depth that is less than the first depth.

9. A method comprising:
providing an extremely thin semiconductor-on-insulator substrate;
disposing a first insulator on a first portion of the substrate and a second insulator on a second portion of the substrate, where a total thickness of the first portion substantially equals a total thickness of the second portion;
forming at least one first device that at least partially overlies the substrate and is disposed on the first insulator and the first portion of the substrate, where the at least one first device comprises a first transistor with a first spacer having a first spacer thickness;
forming at least one second device that at least partially overlies the substrate and is disposed on the second insulator and the second portion of the substrate, where the at least one second device comprises a second transistor with a second spacer having a second spacer thickness; and
thinning the second spacer to reduce the second spacer thickness such that the first spacer thickness is greater than the second spacer thickness, where the first spacer thickness is about 7.5 nm and the thinned second spacer thickness is about 6 nm.

10. The method of claim 9, where the at least one first device comprises at least one first field effect transistor and the at least one second device comprises at least one second field effect transistor.

11. The method of claim 9, further comprising: forming at least one raised source/drain structure coupled to at least one of the at least one first device and the at least one second device.

12. The method of claim 9, where a difference in thickness between the first spacer thickness and the second spacer thickness is about 5% to about 35%.

13. A method comprising:
providing a semiconductor-on-insulator substrate comprised of a top semiconductor layer overlying an insulation layer, where the insulation layer overlies a bottom silicon layer, where the top semiconductor layer has a first thickness, a first width and a first depth, where the top semiconductor layer comprises a first portion and a second portion;
removing part of the second portion of the top semiconductor layer to achieve a second thickness that is less than the first thickness, where the removed part of the second portion is less than an entirety of the second portion;
disposing a first insulator on the first portion of the top semiconductor layer and a second insulator on the second portion of the top semiconductor layer, where a total thickness of the first portion substantially equals a total thickness of the second portion;
forming at least one first device that at least partially overlies and is disposed upon the first insulator and the first portion of the top silicon layer; and
forming at least one second device that at least partially overlies and is disposed upon the second insulator and the second portion of the top silicon layer.

14. The method of claim 13, where a difference in thickness between the first thickness and the second thickness is about a 35% difference.

15. The method of claim 13, where a difference in thickness between the first thickness and the second thickness is in a range of 20% difference to 35% difference.

16. The method of claim 13, where the first thickness is about 10 nm and the second thickness is about 5 nm.

17. The method of claim 13, where the first thickness is about 8 nm and the second thickness is about 5 nm.

18. A method comprising:
providing a semiconductor-on-insulator substrate comprised of a top semiconductor layer overlying an insulation layer, where the insulation layer overlies a bottom silicon layer, where the top semiconductor layer has a first thickness, a first width and a first depth, where the top semiconductor layer comprises a first portion and a second portion;
removing part of the second portion of the top semiconductor layer to achieve: a second thickness that is less than the first thickness, a second width that is less than the first width, and a second depth that is less than the first depth, where the removed part of the second portion is less than an entirety of the second portion;
disposing a first insulator on the first portion of the top semiconductor layer and a second insulator on the second portion of the top semiconductor layer, where a total thickness of the first portion substantially equals a total thickness of the second portion;
forming at least one first device that at least partially overlies and is disposed upon the first insulator and the first portion of the top silicon layer; and
forming at least one second device that at least partially overlies and is disposed upon the second insulator and the second portion of the top silicon layer.

\* \* \* \* \*